United States Patent [19]

Perlich

[11] 4,207,532
[45] Jun. 10, 1980

[54] FREQUENCY SIGNAL SPLITTING CIRCUIT

[75] Inventor: Wayne A. Perlich, Sylmar, Calif.
[73] Assignee: RCA Corporation, New York, N.Y.
[21] Appl. No.: 969,396
[22] Filed: Dec. 14, 1978
[51] Int. Cl.² .................................................. H04B 1/06
[52] U.S. Cl. .................................................. 455/339
[58] Field of Search ............... 325/474, 385, 488–490, 325/315–317, 458; 179/15 FD; 333/126, 129, 131, 132, 177, 193; 343/5 W, 6.5 R

[56] References Cited

U.S. PATENT DOCUMENTS

| | | | |
|---|---|---|---|
| 2,374,735 | 5/1945 | Crosby | 325/489 |
| 3,201,695 | 8/1965 | Mason et al. | 325/315 |
| 3,325,753 | 6/1967 | Shearer et al. | 330/126 |
| 3,577,202 | 5/1971 | Brightman | 179/15 FD |
| 3,748,581 | 7/1973 | Yello | 325/316 |

Primary Examiner—Marc E. Bookbinder
Assistant Examiner—Alexander Gerasimow
Attorney, Agent, or Firm—Samuel Cohen; Robert L. Troike; Raymond E. Smiley

[57] ABSTRACT

A frequency translating circuit such as an intermediate frequency circuit comprises a wide band transformer having a two-terminal secondary and first and second frequency passing filters coupled respectively to one and the other of the secondary terminals. Each of the filters is arranged to pass a different subband of frequencies within the wide band of frequencies passed by the transformer and to act as substantially a short circuit to the other frequency subband.

4 Claims, 3 Drawing Figures

FREQUENCY SIGNAL SPLITTING CIRCUIT

BACKGROUND OF THE INVENTION

The intermediate frequency (IF) stage of some radio frequency receivers is designed to respond to signals in a wide band of frequencies. In some systems the intermediate frequency stage (IF) is coupled to two utilization devices each adapted to operate at a different band of frequencies from the other. The signals are typically separated by filters positioned between the IF stage and respective utilization devices. In one typical prior art arrangement, these filters have been positioned in series. Where one frequency is a multiple of the other, such as a third harmonic, signal rejection is not satisfactory in such a prior art arrangement. In another arrangement each filter is resistively coupled to the IF stage. This latter arrangement introduces signal losses which in some systems cannot be satisfactorily compensated.

SUMMARY OF THE INVENTION

In accordance with the present invention the primary winding of a transformer is adapted to receive and pass to the secondary winding thereof, all frequencies of interest. The secondary winding terminals are coupled respectively to a first filter adapted to pass frequencies in a first band and a second filter adapted to pass frequencies in a second band. The first filter acts substantially as a short to frequencies in the second band and the second filter acts substantially as a short circuit to frequencies in the first band.

DETAILED DESCRIPTION OF THE PREFERRED EMBODIMENT

Figure 1:
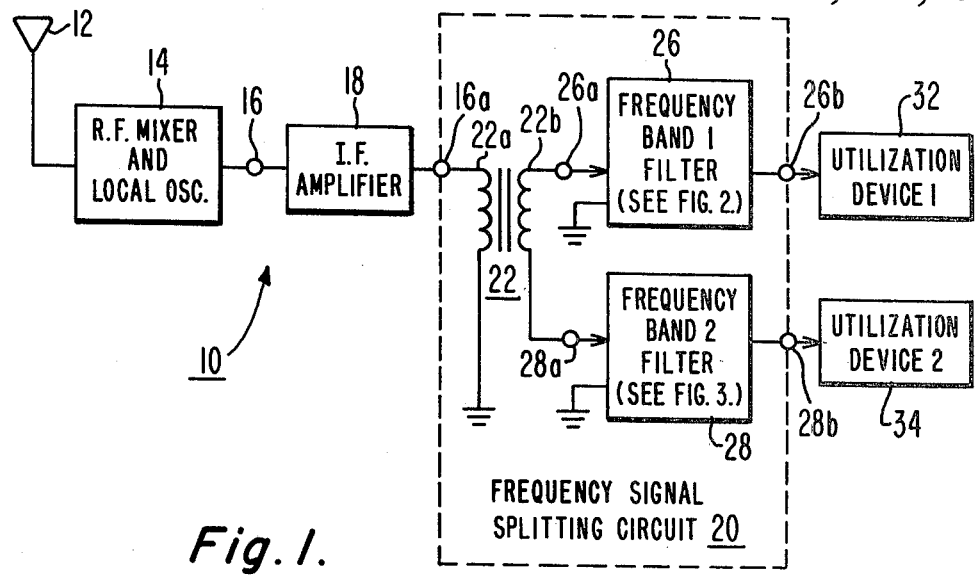
FIG. 1 is a frequency signal splitting circuit in accordance with the invention and components attached to the signal splitting circuit.

A system 10 utilizing the present invention includes an antenna 12 coupled to a radio frequency (RF) mixer and local oscillator circuit 14 for passing radio frequency signals thereto. The radio frequency and local oscillator circuit (hereinafter mixer 14) is of conventional design and may, for example, be part of an airborne weather radar system 10 such as PriMUS model 50 weather radar manufactured and sold by the RCA Corporation 8500 Balboa Boulevard, Van Nuys, California. As is conventional with such weather radars an RF signal is transmitted from antenna 12 to the atmosphere and reflected back to antenna 12 by precipitation and other known meteorological conditions in the atmosphere.

Mixer 14 converts such returned signals, in the exemplary system, to a 30 MHz IF signal at terminal 16. Antenna 12 and mixer 14 in the exemplary system are also adapted to receive signals transmitted from a locating beacon (not shown), placed in position by the aviation authorities, which signals are translated in mixer 14 to an IF of 95 MHz but which may range from 82 to 106 MHz. Thus, at terminal 16, there are presented signals having frequencies in a first band such as for example 30 MHz and signals having frequencies in a second band, eg. 95 MHz.

Amplification, if required, is accomplished by intermediate frequency amplifier 18 which may, for example, be a cascode amplifier of conventional design. Amplifier 18 is coupled to an output terminal 16a which is also the input terminal of the frequency signal splitting circuit 20. If amplifier 18 is not needed, terminals 16 and 16a are shorted. Terminal 16a is connected to the primary winding 22a of a wide band transformer 22. Primary winding 22a is also coupled to a source of reference potential such as ground. Transformer 22 must pass all frequencies of interest (eg. 30 MHz and 95 MHz).

Respective ends of secondary winding 22b are coupled at terminal 26a to a frequency band 1 filter 26 and at terminal 28a to frequency band 2 filter 28. Filter 26 is connected at terminal 26b to a utilization device 1. Filter 28 is connected at terminal 28b to a utilization device 2. Transformer 22, if desired, may provide some amplification by being a step-up transformer such as a 1:2 step-up transformer. Filters 26 and 28 may be both passband filters. Alternatively, one filter may be a high pass filter and the other a low pass filter, or one may be a pass band filter and the other may be either a high pass or low pass filter. All types of filters will hereinafter, in the specification and claims, be referred to as bandpass filters. The only requirement of filter 26 is that it exhibit a relatively high impedance to ground or other source of reference potential with respect to a first band of frequencies passed thereto by a transformer 22 and exhibit a relatively low impedance (ideally a short) to ground or other source of reference potential with respect to a second different band of frequencies passed thereto. Filter 26 passes the first band of frequencies to utilization device 32 for further processing. Conversely, filter 28 exhibits a relatively high impedance to ground with respect to the second band of frequencies passed thereto by transformer 22 and exhibits a relatively low impedance to ground or other source of reference potential with respect to the first band of frequencies passed thereto. Filter 28 passes the second band of frequencies to utilization device 34 for further processing.

Thus, in the exemplary system, filter 26 may, for example, present a high impedance to ground with respect to frequencies at 30 MHz while passing those frequencies to utilization device 32 for further processing. Filter 26 presents a low impedance (substantially a short circuit) to frequencies at 95 MHz. Filter 28 presents a high impedance to ground with respect to frequencies of 95 MHz while passing those frequencies to utilization device 34 for further processing. Filter 28 presents a low impedance (substantially a short circuit) at frequencies of 30 MHz. Utilization device 1, in the exemplary embodiment, is a weather radar amplifying, signal processing, and display system of conventional design, such as found in the RCA PriMUS 50 weather radar. Utilization device 2, in the exemplary embodiment, is a beacon signal amplifier and display device also of conventional design such as found in the RCA PriMUS 50 weather radar.

Operation of system 10 is as follows. Mixer 14 receives and converts to IF, signals received at antenna 12. The IF signals contain frequencies in a first frequency band (Band 1) and frequencies in a second frequency band (Band 2). The frequencies in band 1 are passed by filter 26 to utilization device 32. Since filter 28 appears as a low impedance to the band 1 frequencies, there is no loss in gain between the signal presented at winding 22b and that received at utilization device 32.

Similarly, the frequencies in band 2 are passed by filter 28 to utilization device 34. Also since filter 26 appears as a low impedance to ground at the band 2 frequencies, there is no loss in gain between the signal present at winding 22b and that received at utilization device 34.

Figure 2:
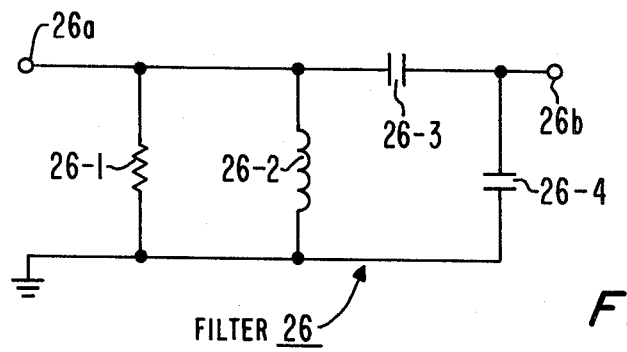
FIG. 2 is a first bandpass filter used in practicing the invention of FIG. 1.
Figure 3:
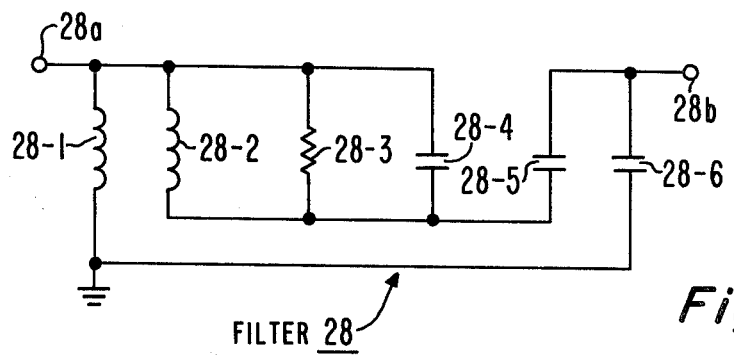
FIG. 3 is a second bandpass filter used in practicing the invention of FIG. 1.

FIGS. 2 and 3 are exemplary bandpass filters useful as filters 26 and 28 respectively, in the system of FIG. 1. Each of these filters is of conventional design and therefore, will not be described in detail. In the exemplary system the following components are used.

| Resistor 26-1 | 1.5KΩ | Inductor 28-2 | 1.0μh |
| --- | --- | --- | --- |
| Inductor 26-2 | 0.39μh | Resistor 28-3 | 2.7KΩ |
| Capacitor 26-3 | 180pf | Capacitor 28-4 | 27pf |
| Capacitor 26-4 | 60pf | Capacitor 28-5 | 820pf |
| Inductor 28-1 | 0.12μh | Capacitor 28-6 | 68pf |
| Transformer 22 Minicircuits Laboratory Model #T1-1 | | | |

What is claimed is:

1. A frequency signal splitting circuit comprising in combination:

a transformer having a primary winding adapted to receive signals in a relatively wide band of frequencies and having a two terminal secondary winding;

a first filter coupled to one terminal of said secondary winding to receive said signals in said wide band of frequencies therefrom, said first filter having an output terminal arranged to pass thereto signals in a first relatively narrow band of frequencies within said wide band of frequencies; and a second filter coupled to the other terminal of said secondary winding to receive said signals in said wide band of frequencies therefrom, said secondary filter having an output terminal and arranged to pass thereto signals in a second relatively narrow band of frequencies within said wide band of frequencies, said first and second relatively narrow bands of frequencies differing from one another, said second filter exhibiting a low impedance, with respect to a circuit reference potential terminal, to said first band of frequencies and exhibiting a relatively high impedance with respect to said circuit reference potential terminal to said second band of said frequencies; said first filter exhibiting a relatively low impedance with respect to said circuit reference potential terminal to said second band of frequencies and exhibiting a relatively high impedance with respect to said circuit reference potential terminal to said first band of frequencies.

2. The combination as set forth in claim 1, futher including a first utilization device coupled to said first filter and receptive of signals in said first narrow band and further including a second utilization device coupled to said second filter and receptive of said signals in said second narrow band.

3. The combination as set forth in claims 1 or 2, further including means producing a relatively wide band of intermediate frequency signals and wherein said transformer is responsive to said intermediate frequency signals.

4. The combination as set forth in claim 3, wherein said means for producing said intermediate frequency signals is a radio frequency mixer and local oscillator.

* * * * *